United States Patent
Singh et al.

(10) Patent No.: US 9,263,385 B1
(45) Date of Patent: Feb. 16, 2016

(54) SEMICONDUCTOR FUSES AND FABRICATION METHODS THEREOF

(71) Applicant: GLOBALFOUNDRIES Inc., Grand Cayman, KY (US)

(72) Inventors: Jagar Singh, Clifton Park, NY (US); Anurag Mittal, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/589,011

(22) Filed: Jan. 5, 2015

(51) Int. Cl.
| | |
|---|---|
| *H01L 23/525* | (2006.01) |
| *H01L 23/538* | (2006.01) |
| *H01L 21/62* | (2006.01) |
| *H01L 21/71* | (2006.01) |
| *H01L 27/24* | (2006.01) |
| *H01L 21/768* | (2006.01) |
| *H01L 29/417* | (2006.01) |
| *H01L 29/45* | (2006.01) |
| *H01L 29/8605* | (2006.01) |
| *H01L 21/8234* | (2006.01) |
| *H01L 27/06* | (2006.01) |
| *H01L 29/78* | (2006.01) |

(52) U.S. Cl.
CPC .... *H01L 23/5256* (2013.01); *H01L 21/823431* (2013.01); *H01L 21/823475* (2013.01); *H01L 27/0617* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 2007/0029576 A1* | 2/2007 | Nowak et al. | 257/209 |
| 2008/0157201 A1* | 7/2008 | Marshall | 257/350 |
| 2009/0206446 A1* | 8/2009 | Russ et al. | 257/529 |
| 2012/0319234 A1* | 12/2012 | Cho et al. | 257/529 |
| 2013/0001741 A1* | 1/2013 | Mann et al. | 257/529 |
| 2014/0264731 A1* | 9/2014 | Kim et al. | 257/529 |
| 2015/0001635 A1* | 1/2015 | Kwon et al. | 257/379 |
| 2015/0076656 A1* | 3/2015 | Kwon et al. | 257/529 |
| 2015/0145059 A1* | 5/2015 | Kwon et al. | 257/379 |
| 2015/0179524 A1* | 6/2015 | Liang et al. | 257/379 |

OTHER PUBLICATIONS

Definition of alignment downloaded from URL < http://www.merriam-webster.com/dictionary/alignment> on Jul. 13, 2015.*

(Continued)

*Primary Examiner* — Joseph Schoenholtz
(74) *Attorney, Agent, or Firm* — Heslin Rothenberg Farley & Mesiti P.C.

(57) ABSTRACT

Semiconductor fuses with epitaxial fuse link regions and fabrication methods thereof are presented. The methods include: fabricating a semiconductor fuse including an anode region and a cathode region electrically linked by a fuse link region, and the fabricating including: forming, epitaxially, the fuse link region between the anode region and the cathode region, wherein the fuse link region facilitates the semiconductor fuse open circuiting from applying a programming current between the anode region and the cathode region thereof. The semiconductor fuses include: an anode region and a cathode region electrically linked by a fuse link region, wherein the fuse link region includes an epitaxial structure and facilitates the semiconductor fuse open circuiting from applying a programming current between the anode region and the cathode region, wherein the epitaxial structure is in at least partial crystallographic alignment with the anode region and the cathode region of the semiconductor fuse.

19 Claims, 10 Drawing Sheets

(56) References Cited

OTHER PUBLICATIONS

Kothandaraman, C.; Iyer, S.K.; Iyer, S.S., "Electrically Programmable Fuse (eFUSE) using Electromigration in Silicides," Electron Device Letters, IEEE, vol. 23, No. 9, pp. 523-525, Sep. 2002.*

Tonti, W., "eFuse Design and Reliability," Integrated Reliability Workshop Final Report, 2008. IRW 2008. IEEE International, pp. 145,145, Oct. 12-16, 2008.*

Tian, C.E.; Moy, D.; Chuck Le; Messenger, B.; Kothandaraman, C.; Safran, J.; Wu, S.; Robson, N.; Iyer, S.S., "Reliability Investigation of NiPtSi Electrical Fuse With Different Programming Mechanisms," Device and Materials Reliability, IEEE Transactions on, vol. 8, No. 3, pp. 536,542, Sep. 2008.*

Tian, C.; Moy, D.; Messenger, B.; Kothandaraman, C.; Safran, J.; Wu, S.; Robson, N.; Iyer, S.S., "Reliability investigation of NiPtSi electrical fuse with different programming mechanisms," Integrated Reliability Workshop Final Report, 2007. IRW 2007. IEEE International, pp. 90,93, Oct. 15-18, 2007.*

Safran, J.; Leslie, A.; Fredeman, G.; Kothandaraman, C.; Cestero, A.; Xiang Chen; Rajeevakumar, R.; Kim, Deok-kee; Yan Zun Li; Moy, D.; Robson, N.; Kirihata, T.; Iyer, S., "A Compact eFUSE Programmable Array Memory for SOI CMOS," VLSI Circuits, 2007 IEEE Symposium on, pp. 72,73, Jun. 14-16, 2007.*

Andrew Kim et al., "Method to Form One-Time-Programmable Metal Line Efuse with Heat Cage", 22 pages.

Randy Mann et al., "Integrated Circuit with a Fin-Based Fuse, and Related Fabrication Method", 24 pages.

Hoong Shing Wong et al., "Methods of Manufacturing Integrated Circuits Having Finfet Structures with Epitaxially Formed Source/Drain Regions", 26 pages.

Osung Kwon et al., "Methods of Forming an E-Fuse for an Integrated Circuit Product and the Resulting Integrated Circuit Product", 38 pages.

http://www.attopsemi.com/tec2.htm, 2 pages.

* cited by examiner

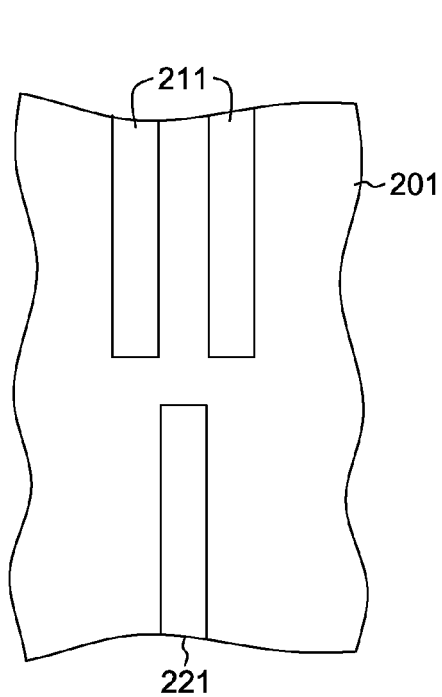 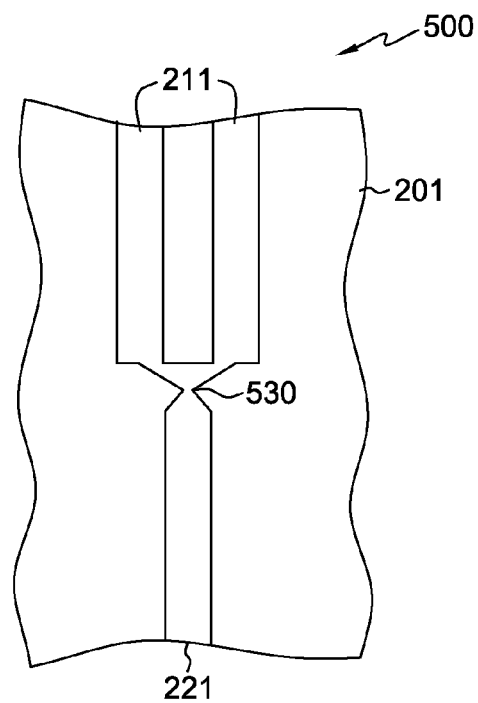
FIG. 5A   FIG. 5B
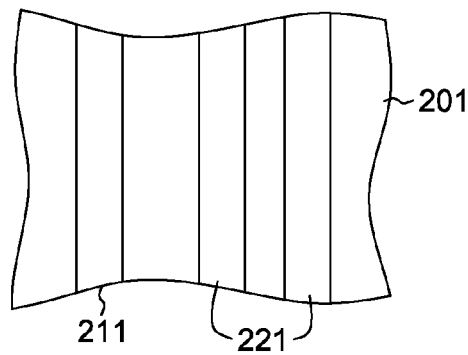 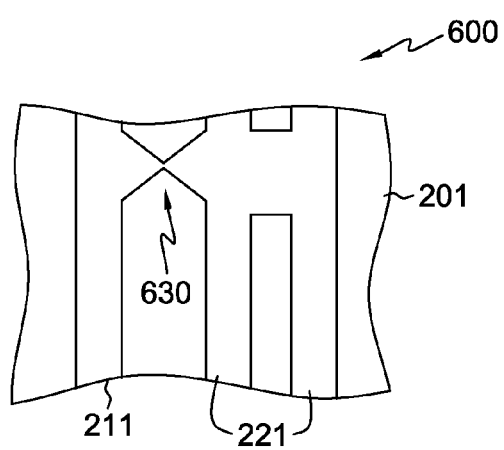
FIG. 6A   FIG. 6B

SEMICONDUCTOR FUSES AND FABRICATION METHODS THEREOF

FIELD OF THE INVENTION

The present invention relates to semiconductor devices and methods for fabricating semiconductor devices, and more particularly to semiconductor fuses and fabrication methods thereof.

BACKGROUND OF THE INVENTION

Semiconductor fuse technology, sometimes called "e-fuse" technology, allows for post-fabrication hardware programming of integrated circuits. By analogy with a standard household fuse, a semiconductor fuse can be designed to permanently open circuit upon application of a programming current. By including one or more semiconductor fuses in an integrated circuit, on-chip modifications, one time programmable (OTP) memory, and/or circuit tuning functions can be provided. For example, using appropriate sensing circuits, a semiconductor fuse can represent a binary "1" when close circuited, and a binary "0" when open circuited.

Integrated circuit fabrication processes include numerous process steps, such photolithographic patterning, material deposition and material removal steps. Each step requires a wafer to be exposed to a variety of chemical and/or mechanical steps, and incurs production costs and time. Therefore, a need exists for semiconductor fuses and fabrication methods that reduce or eliminate process steps.

BRIEF SUMMARY

The shortcomings of the prior art are overcome, and additional advantages are provided, through the provision, in one aspect, of a method. The method includes: fabricating a semiconductor fuse including an anode region and a cathode region electrically linked by a fuse link region, and the fabricating including: forming, epitaxially, the fuse link region between the anode region and the cathode region, where the fuse link region facilitates the semiconductor fuse open circuiting from applying a programming current between the anode region and the cathode region thereof.

In another aspect, a structure including a semiconductor fuse is presented. The semiconductor fuse includes: an anode region and a cathode region electrically linked by a fuse link region, where the fuse link region includes an epitaxial structure and facilitates the semiconductor fuse open circuiting from applying a programming current between the anode region and the cathode region, where the epitaxial structure is in at least partial crystallographic alignment with the anode region and the cathode region of the semiconductor fuse.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 5A-5B depict another process for fabricating a semiconductor fuse, in accordance with one or more aspects of the present invention; and FIGS. 6A-6B depict another process for fabricating a semiconductor fuse, in accordance with one or more aspects of the present invention.

DETAILED DESCRIPTION

Figure 1A:
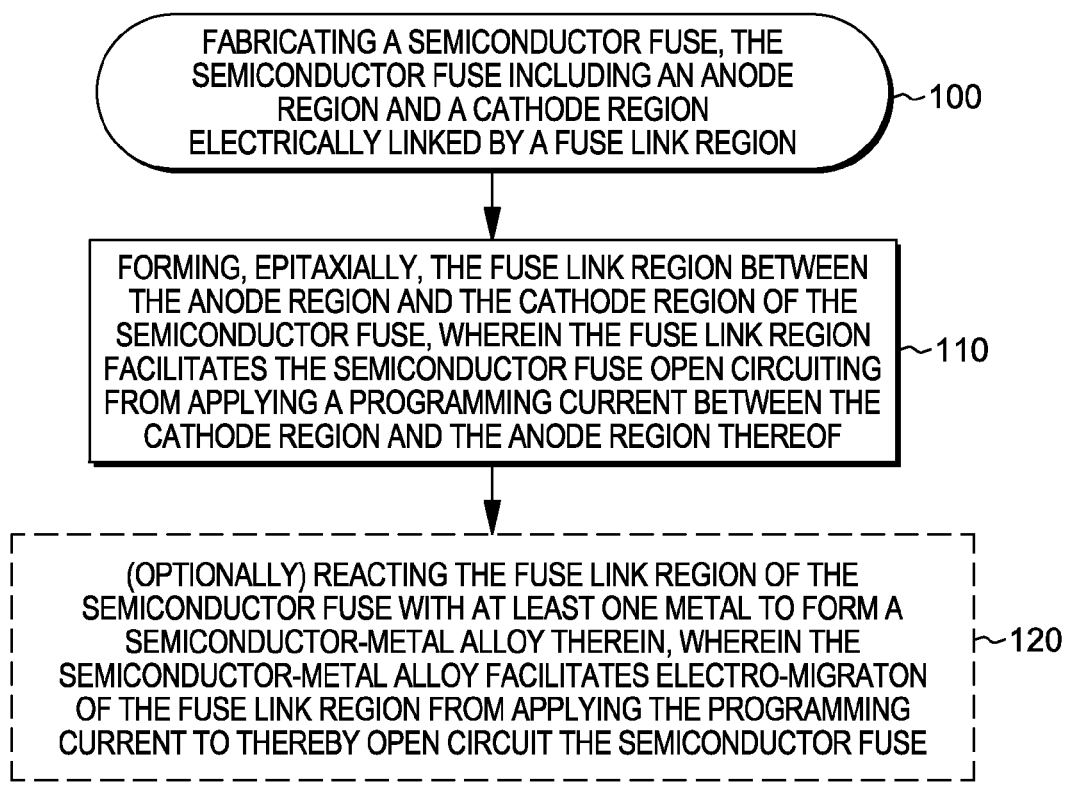
FIGS. 1A-1B depict embodiments of processes for fabricating semiconductor fuses, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/ or scope of the underlying inventive concepts will be apparent to those skilled in the art from this disclosure.

Disclosed herein, at least in part, are semiconductor fuses and methods of fabricating semiconductor fuses. As used herein, a semiconductor fuse is a semiconductor structure that can be open circuited upon application of a programming current. For instance, a semiconductor fuse can include an anode region, a cathode region, and fuse link region. In addition, in normal operation a current can flow from the anode region to the cathode region through the fuse link region. Further, a programming current can be used to open circuit the semiconductor fuse, for example by physically breaking the fuse link region so that current cannot flow from the anode region to the cathode region. For example, semiconductor fuses, also known as "e-fuses" can enable on-chip programmability, may be used as OTP memory, can be used for security applications, or can be used to change circuit tuning. By contrast with semiconductor fuses, metal based fuses require higher current and power to open circuit.

Advantageously, the techniques disclosed herein are compatible with a variety of semiconductor fabrication techniques, allowing for semiconductor fuses to be formed using the same processes used to form, for example, complementary metal oxide semiconductor (CMOS) devices, such as metal oxide semiconductor field-effect transistors (MOSFETs). For example, in CMOS processing, photolithographic patterning techniques are used to define millions, billions, or more transistors, which include source regions, drain regions, and channel regions. In such a case, a set of masks are used in the fabrication process. By adjusting the set of masks used in processing, the present disclosure allows for the fabrication of semiconductor fuses using, at least in part, the same process steps used for the formation of transistors. For instance, the same processes steps for forming source regions or drain regions can be used, using appropriate mask sets, to form one or more portions of the semiconductor fuses. By making use of process steps used for the formation of transistors, instead of adding new special purpose process steps, the present disclosure provides semiconductor fuses at little to no additional processing costs.

In addition, three-dimension fin structures that extend from a semiconductor substrate are used to form fin field-effect transistors (finFETs). In such a case, in the beginning stages of semiconductor fabrication processing, numerous fin structures are formed over a chip area of a wafer, and the fin structures are modified in subsequent processing steps to form transistors. The present disclosure allows for the fabrication of semiconductor fuses using such fin technology, in addition to bulk silicon or silicon-on-insulator technology. For example, the present disclosure allows for semiconductor fuses having the same critical dimensions as the transistors, such as the dimension of the fin structures.

Further, in semiconductor fabrication processing, transistors are formed in front end of line (FEOL) processes, and are interconnected in back end of line (BEOL) process. The present disclosure allows for formation of semiconductor fuses in FEOL processes, thereby allowing for fuses located in the active region and with reduced power and current needed to open circuit the fuses, leading to shorter programming time.

Generally stated, provided herein, in one aspect, is a structure including a semiconductor fuse. The semiconductor fuse includes: an anode region and a cathode region electrically linked by a fuse link region, where the fuse link region includes an epitaxial structure and facilitates the semiconductor fuse open circuiting from applying a programming current between the anode region and the cathode region, where the epitaxial structure is in at least partial crystallographic alignment with the anode region and the cathode region of the semiconductor fuse.

In one embodiment, the fuse link region has a smaller minimum dimension than a minimum dimension of the anode region or another minimum dimension of the cathode region of the semiconductor fuse, the smaller minimum dimension of the fuse link region facilitating the semiconductor fuse open circuiting from the applying the programming current.

In another embodiment, the anode region of the semiconductor fuse facilitates dissipation of heat produced from the applying the programming current to open circuit the semiconductor fuse. In a further embodiment, the cathode region has a first surface area and the anode region has a second surface area, where the second surface area is larger than the first surface area.

In one example, the fuse link region of the semiconductor fuse includes a semiconductor-metal alloy, where the semiconductor-metal alloy facilitates electro-migration of the fuse link region from the applying the programming current to thereby open circuit the semiconductor fuse.

In another example, the structure further includes at least one first fin structure and at least one second fin structure, the at least one first fin structure including the anode region and the at least one second fin structure including the cathode region, where the epitaxial structure is in at least partial crystallographic alignment with the at least one first fin structure and the at least one second fin structure. In such a case, the structure can further include an isolation material disposed between the at least one first fin structure and the at least one second fin structure, where the fuse link region is disposed at least partially over the isolation material.

Reference is made below to the drawings, which are not drawn to scale for ease of understanding, where the same reference numbers used throughout different figures designate the same or similar components.

Figure 1B:
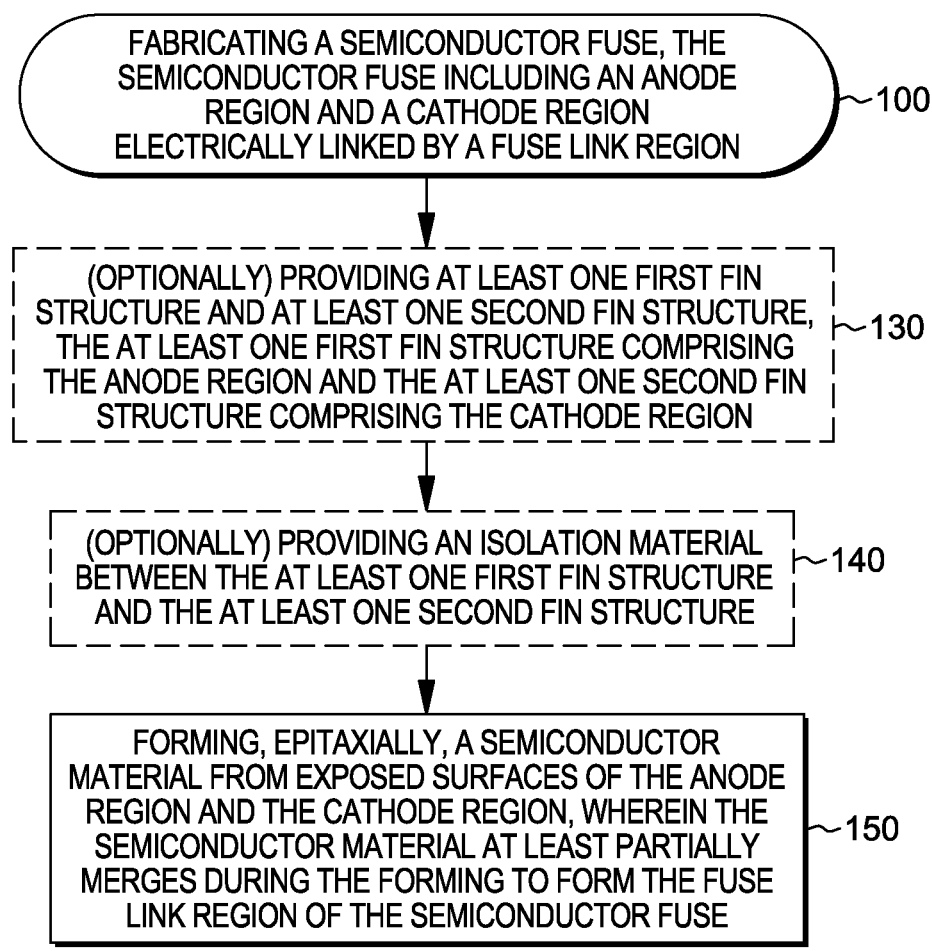

FIGS. 1A-1B depict embodiments of processes for fabricating semiconductor fuses, in accordance with one or more aspects of the present invention. With reference to FIG. 1A, in one embodiment, the method includes fabricating a semiconductor fuse, the semiconductor fuse including an anode region and a cathode region electrically linked by a fuse link region 100, includes: forming, epitaxially, the fuse link region between the anode region and the cathode region of the semiconductor fuse, where the fuse link region facilitates the semiconductor fuse open circuiting from applying a programming current between the anode region and the cathode region thereof 110.

In another embodiment, the method further includes reacting the fuse link region of the semiconductor fuse with at least one metal to form a semiconductor-metal alloy therein, wherein the semiconductor-metal alloy facilitates electromigration of the fuse link region from the applying the programming current to thereby open circuit the semiconductor fuse 120.

In a further embodiment, the forming 110 includes forming, epitaxially, a semiconductor material from exposed surfaces of the anode region and the cathode region, wherein the semiconductor material at least partially merges during the forming to form the fuse link region of the semiconductor fuse.

In one example, the forming 110 includes forming the fuse link region with a smaller minimum dimension than a minimum dimension of the anode region or another minimum dimension of the cathode region of the semiconductor fuse, the smaller minimum dimension of the fuse link region facilitating the semiconductor fuse open circuiting from the applying the programming current.

In another example, the anode region of the semiconductor fuse facilitates dissipation of heat produced from the applying the programming current to open circuit the semiconductor fuse.

In a further example, the fabricating 100 includes fabricating the cathode region with a first surface area and the anode region with a second surface area, wherein the second surface area is larger than the first surface area.

In one embodiment, the fabricating 100 includes forming the fuse link region to include at least one tapered region, the at least one tapered region of the fuse link region facilitating the semiconductor fuse open circuiting from the applying the programming current.

In another embodiment, the fuse link region includes multiple fuse links, wherein one fuse link of the multiple fuse links facilitates the semiconductor fuse open circuiting from the applying the programming current, and another fuse link of the multiple fuse links facilitates the semiconductor fuse open circuiting from applying another programming current between the anode region and the cathode region of the semiconductor fuse.

With respect to FIG. 1B, in a one embodiment, the fabricating 100 can include providing at least one first fin structure and at least one second fin structure, the at least one first fin structure comprising the anode region and the at least one second fin structure comprising the cathode region 130.

In another embodiment, the fabricating 100 can include forming, epitaxially, a semiconductor material from exposed surfaces of the at least one first fin structure, including the anode region thereof, and the at least one second fin structure, including the cathode region thereof, wherein the semiconductor material at least partially merges during the forming to form the fuse link region of the semiconductor fuse.

In such a case, in one example, the at least one first fin structure can include two fin structures, and the fuse link region can include multiple fuse links, where one of the multiple fuse links is between one of the two fin structures and the at least one second fin, and the other of the multiple fuse links is between the other of the two fin structures and the at least one second fin. In another example, the at least one first fin structure or the at least one second fin structure can further include a transistor, the transistor including a source region and a drain region separated by a channel region, and the forming 100 further can further include forming, epitaxially, the semiconductor material from exposed surfaces of the at least one first fin structure or the at least one second fin structure to form the source region and the drain region of the transistor.

In a further embodiment, the providing 130 comprises providing an isolation material between the at least one first fin structure and the at least one second fin structure 140. In such a case, the forming can include forming the semiconductor material from exposed upper surfaces of the at least one first fin structure and the at least one second fin structure, where the fuse link region is formed at least partially over the isolation material.

In one example, the providing 130 includes: providing the at least one first fin structure substantially parallel to the at least one second fin structure, wherein a tip of the at least one first fin structure is substantially aligned with another tip of the at least one second fin structure.

Figure 2A:
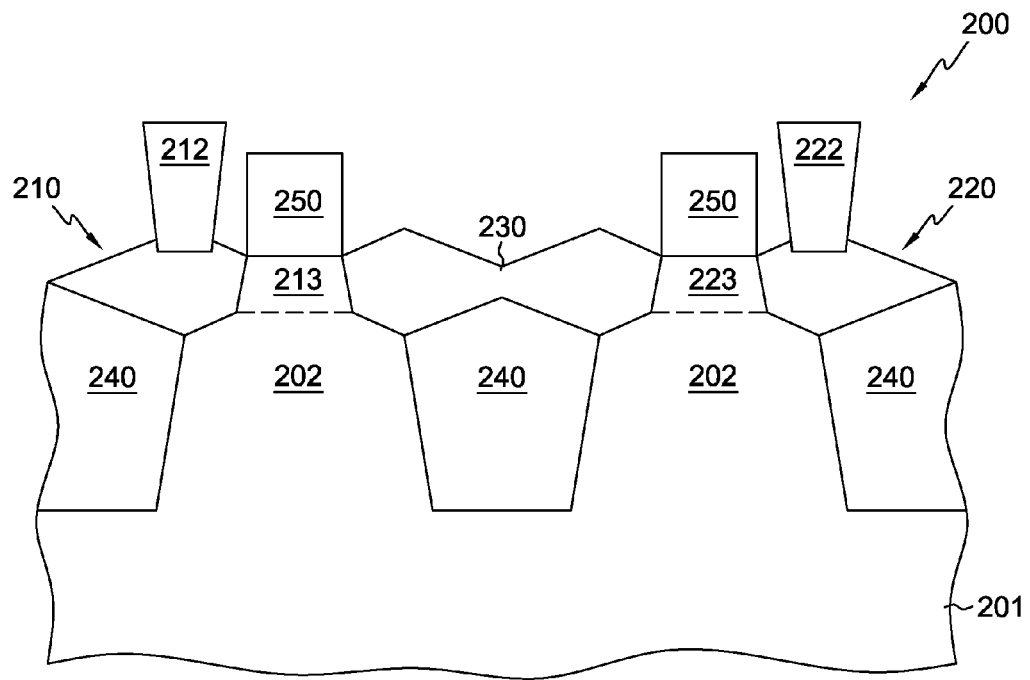
FIG. 2A is a cross sectional elevational view of a semiconductor fuse, taken along line 2A-2A of FIG. 2B, in accordance with one or more aspects of the present invention.
Figure 2B:
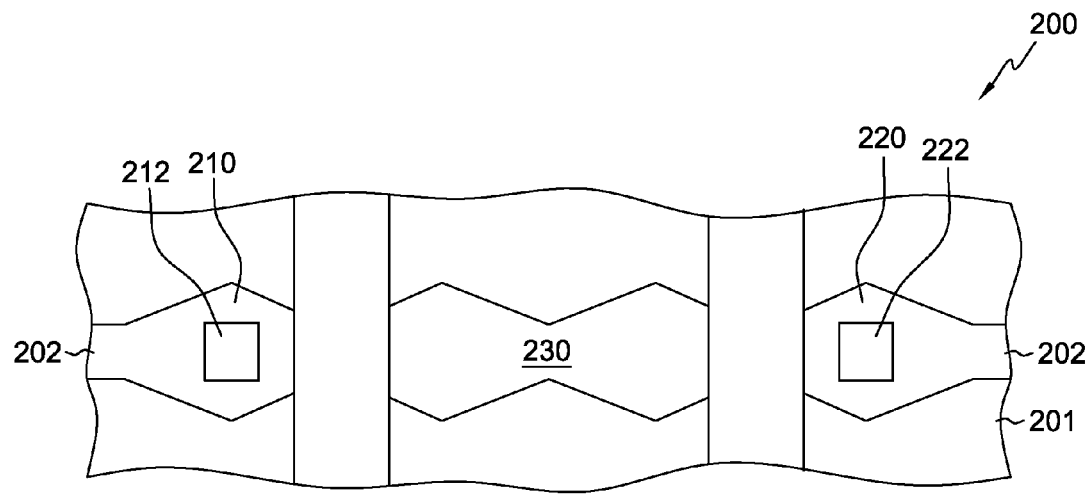
FIG. 2B is a plan view of the semiconductor fuse of FIG. 2A, in accordance with one or more aspects of the present invention.

FIG. 2A is a cross sectional elevational view of a semiconductor fuse 200, taken along line 2A-2A of FIG. 2B, in accordance with one or more aspects of the present invention. In the illustrated embodiment, semiconductor fuse 200 includes an anode region 210 and a cathode region 220 electrically linked by a fuse link region 230.

In one embodiment, fuse link region 230 facilitates semiconductor fuse 200 open circuiting from applying a programming current between anode region 210 and cathode region 220. For example, fuse link region 230 has a smaller minimum dimension than minimum dimensions of anode region 210 or cathode region 220. In such an example, the smaller minimum dimension of fuse link region 230 can facilitate semiconductor fuse 200 open circuiting from applying the programming current because the smaller minimum dimension has a higher resistance, leading to failure of fuse link region 230 at the smaller minimum dimension portion.

In one embodiment, fuse link region 230 includes a semiconductor-metal alloy, and the mechanism by which the semiconductor fuse open circuits can be electromigration. For example, semiconductor fuse can include silicon (Si), and fuse link portion 230 can be reacted with a metal, such as nickel (Ni), to form a silicide, such as nickel silicide (NiSi). In such a case, case the semiconductor-metal alloy facilitates electromigration of fuse link region 230 from applying the programming current to thereby open circuit semiconductor fuse 200.

By way of explanation, electromigration is the transport of material caused by momentum exchange between electrons and atoms. For example, when a programming current is applied between anode region 210 and cathode region 220, the greatest current density will be in the portion of semiconductor fuse 200 with the smallest minimum dimension, fuse link region 230. In addition, a narrow region of the semiconductor fuse offers a higher resistance to the carrier flow. When a sufficient programming current is applied for a sufficient period of time, electromigration of material of fuse link portion 230 can occur first in the portion with the smallest critical dimension. In such a case, the fuse link portion will have the highest temperature, with the heat proportional to $I^2 \times r$, where I is the current and r is the resistance. In addition, conductive material of fuse link region 230 will be transported by electromigration towards cathode region 220, breaking the circuit between anode region 210 and cathode region 220 and thereby open circuiting semiconductor fuse 200. In an electro migration induced open circuit, in the open state, the semiconductor fuse offers significantly higher resistance, for example 10,000 times greater, as compared to the closed circuit state. Advantageously, fuse link region 230 has a narrow minimum dimension, making it an ideal choice as an electromigration point, thereby controlling the electro-migration location.

In the embodiment of FIG. 2A, fuse link region 230 includes two tapered regions, tapered in opposite directions to form a portion with a smallest minimum dimension. By tapering in opposite directions, there is naturally a reduction in the minimum dimension that is created in fuse link region 230. In such a case, when enough of the material of fuse link region 230 is transported in a direction towards anode region 220 by electromigration, semiconductor fuse 200 will open circuit, and there will be a break in the fuse link region. In addition, a specific programming current level can be selected by appropriately selecting the minimum critical dimension of fuse link portion 230, and/or material properties of fuse link region 230. In one example, Joule heating can assist the electromigration process. In another example, anode region 210 can facilitate dissipation of the heat produced from applying the programming current to open circuit semiconductor fuse 200.

In the embodiment of FIG. 2A, fuse link region 230 is disposed at least partially over an isolation material 240. For instance, isolation material 240 directs the current flow through the fuse link region of the semiconductor fuse due to isolation property of the materials such as silicon oxide ($SiO_2$) and silicon nitride ($Si_3N_4$) etc. Specifically, the isolation material generally has poor heat conductivity (e.g., a lower heat conductivity than the fuse link region, thereby confining the heat within the fuse link region. As a result, the fuse link region will experience a rise in temperature, favoring the electro migration phenomena within the fuse link region. In addition, the isolation material can also protect other portions of the integrated circuit and/or wafer during operation of semiconductor fuse 200. Further, isolation material 240 can prevent heat damage to surrounding portions of the integrated circuit when a programming current is applied to open circuit semiconductor fuse 200 because isolation material 240 is between fuse link portion 230 and substrate 201.

In one embodiment, anode region 210 and/or cathode region 220 can include an epitaxial material disposed over fin structure(s) 202. In another embodiment, an anode contact 212 and/or a cathode contact 222 can be included. For example, the anode contact and/or the cathode contact can be formed during the formation of a first metallization layer of an integrated circuit, such as the metal one (Ml) layer.

In a further embodiment, anode region 210 can include a doped region 213 of the fin structure(s) and cathode region 220 can include a doped region 223 of the fin structure(s). In such a case, the doped regions can be p-type doped or n-type doped. In another embodiment, gate structures 250, such as polycrystalline silicon (poly) gates or metal gates, can be included over anode region 210 and/or cathode region 220. In such a case, gate structures 250 can be present as part of an overall fabrication process that allows the formation of transistors, such as field-effect transistors, concurrent with the formation of semiconductor fuses. In one example, doped regions can provide low contact resistance to contacts, such as the anode contact and/or cathode contact. Gate structures 250 can be included, for example, to allow the fabrication process described herein to remain compatible with CMOS fabrication technology, or to meet a minimum poly density design rule requirements.

FIG. 2B is a plan view of semiconductor fuse 200, in accordance with one or more aspects of the present invention. In the illustrated embodiment, fuse link region 230 includes at least one tapered region in three dimensions, defining a fuse link that has a smaller minimum dimension in two perpendicular dimensions (see FIG. 2A).

FIGS. 2C-2G depict embodiments of processes for fabricating semiconductor fuses, in accordance with one or more aspects of the present invention. As described below, numerous bulk fins are provided over a wafer, and subsequently cut to form fin structures. The fin structures can include the anode regions and cathode regions of semiconductor fuses. Next, in a bulk formation process, numerous fuse link regions are formed using epitaxial growth. In one embodiment, thousands, millions, or more semiconductor fuses can be formed in such a process, in various regions of a semiconductor wafer.

Figure 2C:
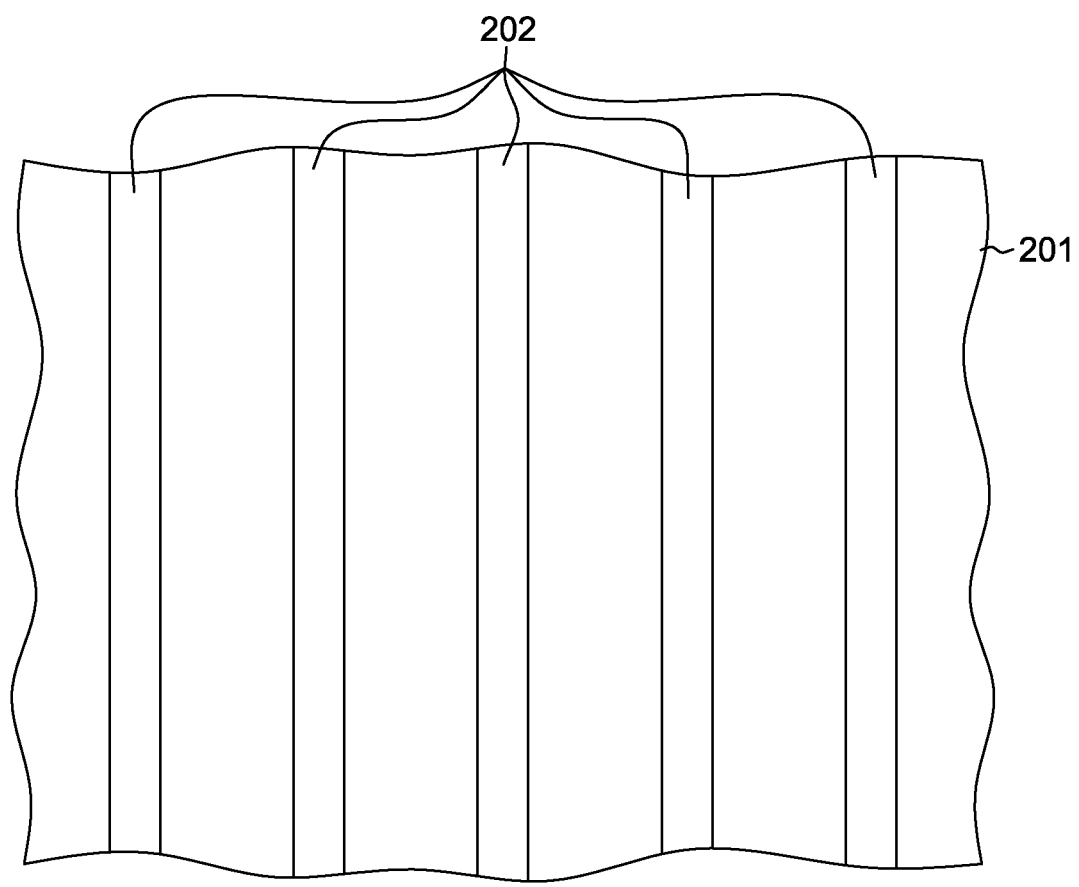
FIG. 2C is a plan view of a structure having multiple fins extending from a substrate, in accordance with one or more aspects of the present invention.

FIG. 2C is a plan view of a structure having multiple fins 202 extending from a substrate 201, in accordance with one or more aspects of the present invention. In the embodiment of FIG. 2C, substrate 201 may be (in one example) a bulk semiconductor material such as a bulk silicon wafer. As another example, substrate 201 may include any silicon-containing substrate including, but not limited to, silicon (Si), single crystal Si, polycrystalline Si, amorphous Si, Si-on-nothing (SON), Si-on-insulator (SOI), or Si-on-replacement insulator (SRI) substrates and the like, and may be n-type or p-type doped. In one particular example, substrate 201 might be, for instance, approximately 600-700 micrometers thick. As depicted in FIG. 2C, fin 202 extend above substrate 201. By way of example, fins 202 may be formed by removing one or more portions of substrate 201, thereby creating one or more fins 202 of the same material as substrate 201, which may be, for example a semiconductor or crystalline material. In another example, formation of fins 202 may be achieved by patterning substrate 201 using various schemes, including: direct lithography; sidewall image transfer technique; extreme ultraviolet lithography (EUV); e-beam technique; litho-etch litho-etch; or litho-etch litho-freeze. Following patterning, removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fins 202 may have a height of about 40 nanometers, and a length of about one micrometer, several micrometers, or the diameter of the entire wafer, while the thickness of the fin may be approximately 10 nanometers or less. In one embodiment, numerous fins are formed over an entire wafer or an entire die of a wafer. In such an embodiment, the fins can be formed at the smallest critical dimension during a single initial fin formation process.

Figure 2D:
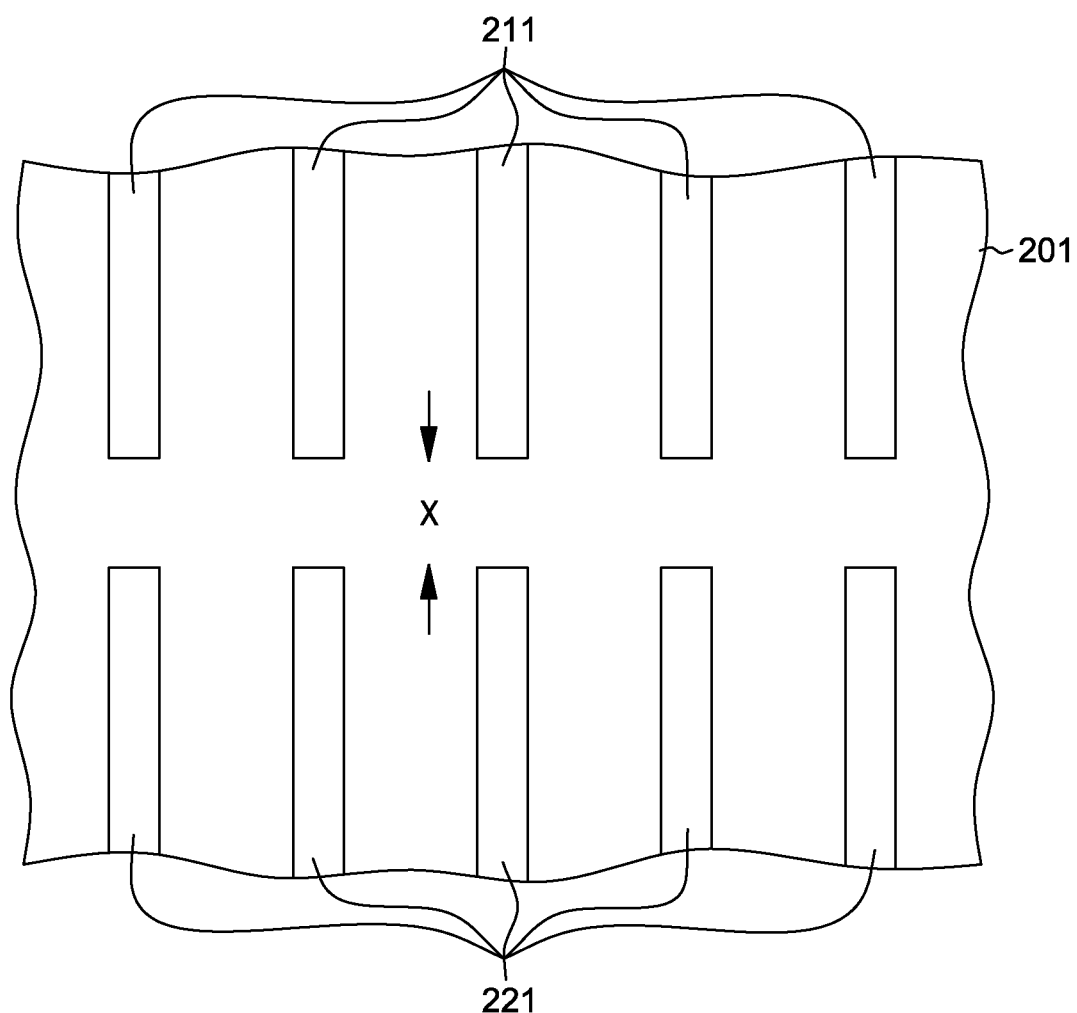
FIG. 2D depicts the structure of FIG. 2C after performing a fin cut process on the multiple fins thereof to form first fin structure(s) and second fin structure(s), in accordance with one or more aspects of the present invention.

FIG. 2D depicts the structure of FIG. 2C after performing a fin cut process on fins 202 (see FIG. 2C) thereof to form first fin structure(s) 211 and second fin structure(s) 221, in accordance with one or more aspects of the present invention. In one embodiment fins 202 (see FIG. 2C) can be cut or removed as needed to implement a specific semiconductor circuit design. For example, numerous parallel fins can be formed in an initial process, and numerous transistors, semiconductor fuses, and other devices can be formed on the fins. In one embodiment, photolithographic patterning and etching can be used to cut away portions of the fins to yield appropriately dimensioned fin structures.

In the embodiment of FIG. 2D, first fin structure(s) 211 and second fin structure(s) 221 are separated by a distance x. The distance of separation can be selected, or tuned, in order to influence the orientation of a fuse link portion of a formed semiconductor fuse, so that the fuse link will open circuit at the appropriate programming current. The exact programming current can be determined by forming numerous semiconductor fuses with different smallest minimum dimensions, and testing the semiconductor fuses to determine the necessary programming current to open circuit the semiconductor fuse.

Figure 2E:
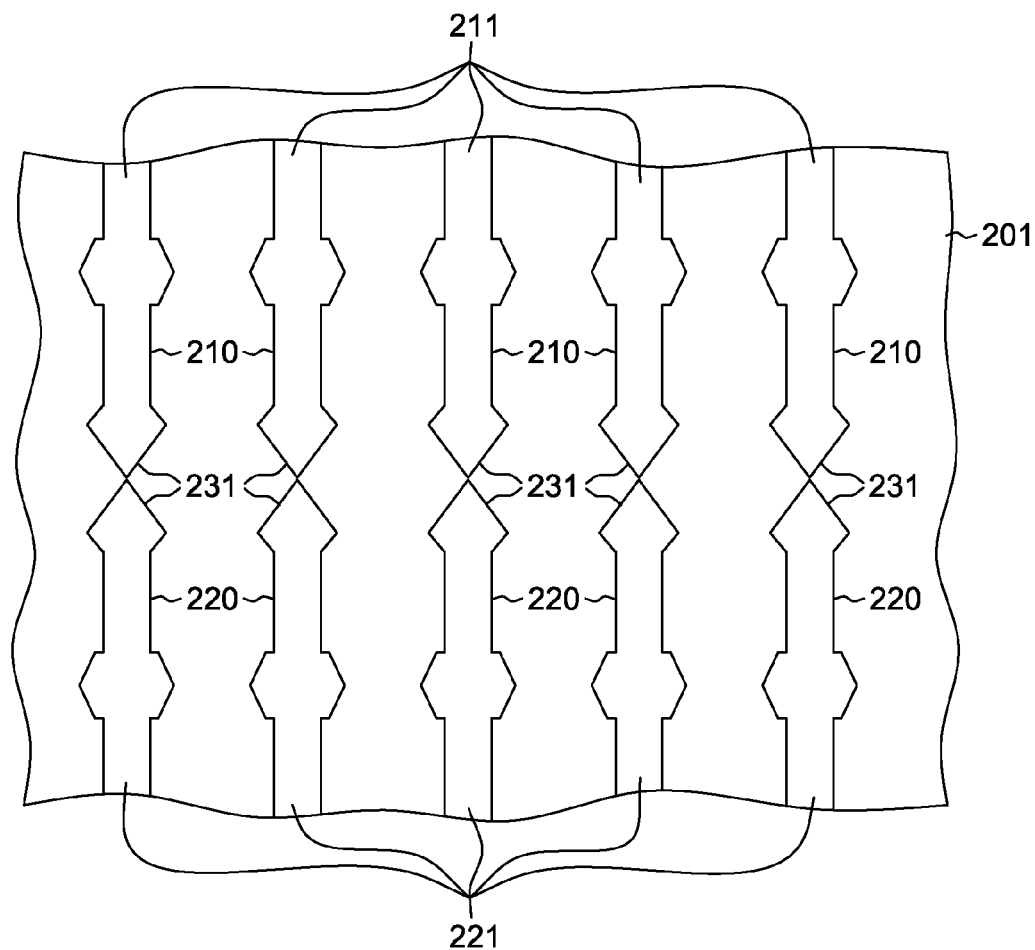
FIG. 2E depicts the structure of FIG. 2D after forming, epitaxially, a semiconductor material from exposed surfaces of an anode region(s) and a cathode region(s) of a semiconductor fuse(s) thereof, in accordance with one or more aspects of the present invention.

FIG. 2E depicts the structure of FIG. 2D after forming, epitaxially, a semiconductor material 231 from exposed surfaces of anode region(s) 210 and a cathode region(s) 220 of a semiconductor fuse(s) 200 thereof, in accordance with one or more aspects of the present invention. In one embodiment, first fin structure(s) 211 include anode region(s) 210 and second fin structure(s) 221 include cathode region(s) 220.

By way of explanation, an epitaxial formation or growth process is a process in which an epitaxial crystalline structure is formed on an underlying crystalline structure. In an epitaxial formation processes, at the shared interface between the formed epitaxial crystalline structure and the underlying crystalline structure, the two structures have the same crystalline symmetry and orientation. The two structures can be the same material (homoepitaxy) or different materials (heteroepitaxy) that have a common crystal lattice structure. For example, the following materials, among others, all share the diamond cubic crystal structure or the analogous multi-element zincblende crystal structure and can be used as semiconductor material 231 with the present techniques: silicon; germanium; carbon; silicon germanium; silicon carbide; gallium arsenide; and indium antimonide.

In addition, growth rates during epitaxial formation can be different depending on the crystallographic orientation of the underlying crystalline structure. For example, for silicon, the highest growth rate is perpendicular to a <110> plane, the next highest is perpendicular to a <100> plane, and the lowest is perpendicular to a <111> plane. As a consequence of these different growth rates, angular facets can be formed during epitaxial growth. For example, epitaxial growth from a vertical <110> plane, such as the sidewall of a fin structure will extend horizontally (perpendicular to the <110> plane) faster than it will extend in any other direction, thereby leading to the growth of an angular structure protruding from the vertical <110> plane. In such a case, the angular planes of the angular structure can be <111> planes, because of the low growth rate along such planes.

Further, selective epitaxial formation can be achieved by masking some regions of an underlying semiconductor structure and leaving others exposed. In such a case, epitaxial formation can only occur on the exposed portions of the semiconductor structure, because the semiconductor material will only be formed from the exposed portions which can act as a seed for crystal growth. For example, in the embodiment of FIG. 2E, various portions of first fin structure(s) 211 and second fin structure(s) 221 can be selectively masked to prevent epitaxial growth, thereby confining epitaxial growth only to specified portions of the fin structures.

Advantageously, formation of the diamond shaped structures for the semiconductor fuses can be achieved during a CMOS fabrication process, such as source or drain processing for p-type field-effect transistors (PFETs), allowing formation of the semiconductor fuses at the same time as fabrication of transistors. In this process, transistor performance is increased by introducing stress into channel regions of the PFETs using the diamond shaped structures formed in cavities. For example, source and drain regions can be etched before epitaxial deposition by chemicals, such as tetramethylammonium hydroxide (TMAH). After etching, <111> and <100> planes can be revealed in the semiconductor, allowing for preferential epitaxial growth in the subsequent processing. For example, the final epitaxial growth within the etched cavities will have diamond shapes which can merge with nearby regions as described herein.

Figure 2F:
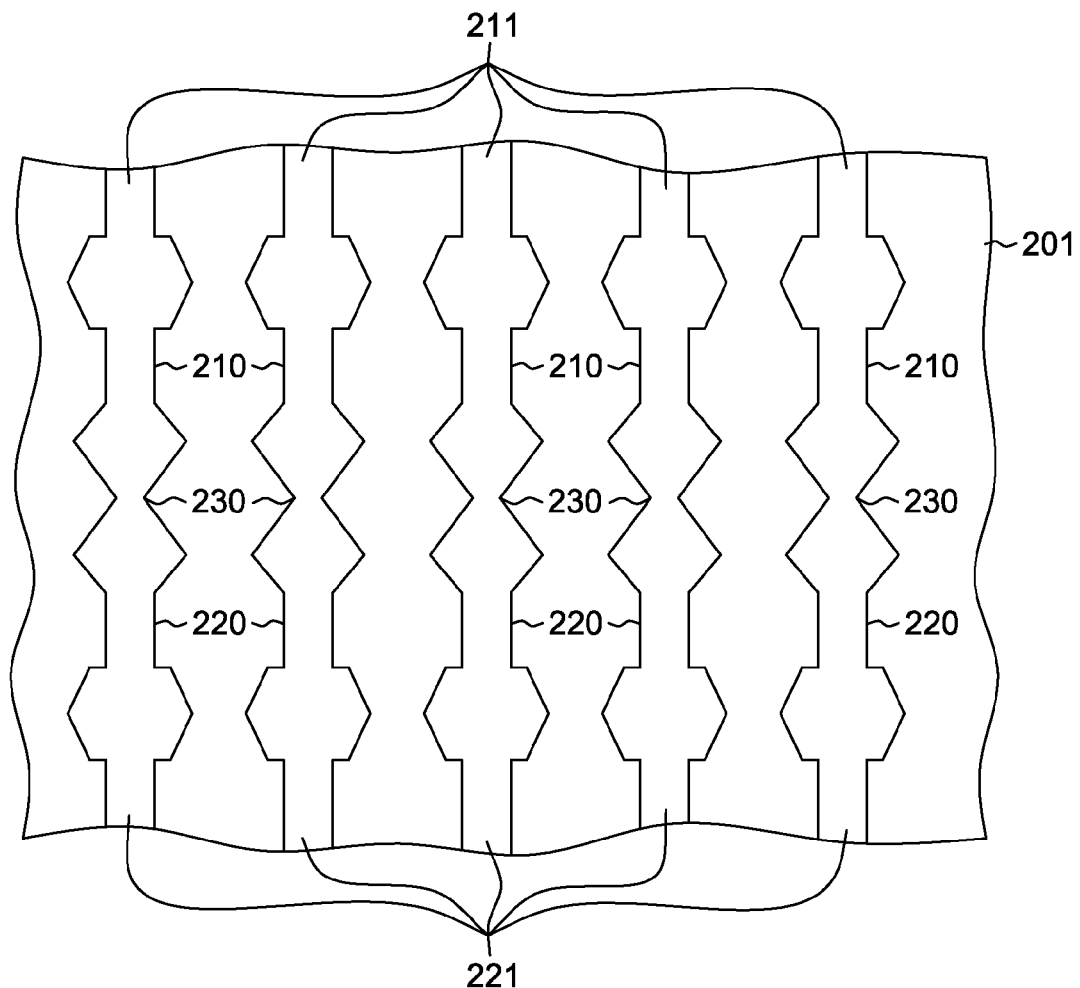
FIG. 2F depicts the structure of FIG. 2E after forming, epitaxially, a fuse link region(s) between the anode region(s) and the cathode region(s) of the semiconductor fuse(s) thereof, in accordance with one or more aspects of the present invention.

FIG. 2F depicts the structure of FIG. 2E after forming, epitaxially, fuse link region(s) 230 between anode region(s) and the cathode region(s) of the semiconductor fuse(s) thereof, in accordance with one or more aspects of the present invention. In one embodiment, forming fuse link region(s) 230 includes semiconductor material 231 (see FIG. 2E) at least partially merging during the forming to form fuse link region(s) 230 of the semiconductor fuse. During epitaxial formation, certain crystal planes can grow faster than other crystal planes, as noted above. In one example, the upper surface of the substrate can be or include a <100> plane, and sidewalls of the fin structures can be or include <110> planes. In such a case, the semiconductor material can grow in an angular shape, meeting and merging between first fin structure(s) 211 and second fin structure(s) 221. By timing the duration of epitaxial formation, including the duration of merging of the two angular structures (see FIG. 2E), the smallest minimum dimension of fuse link region(s) 230 can be chosen and tuned so that an appropriate programming current can open circuit the semiconductor fuse.

Figure 2G:
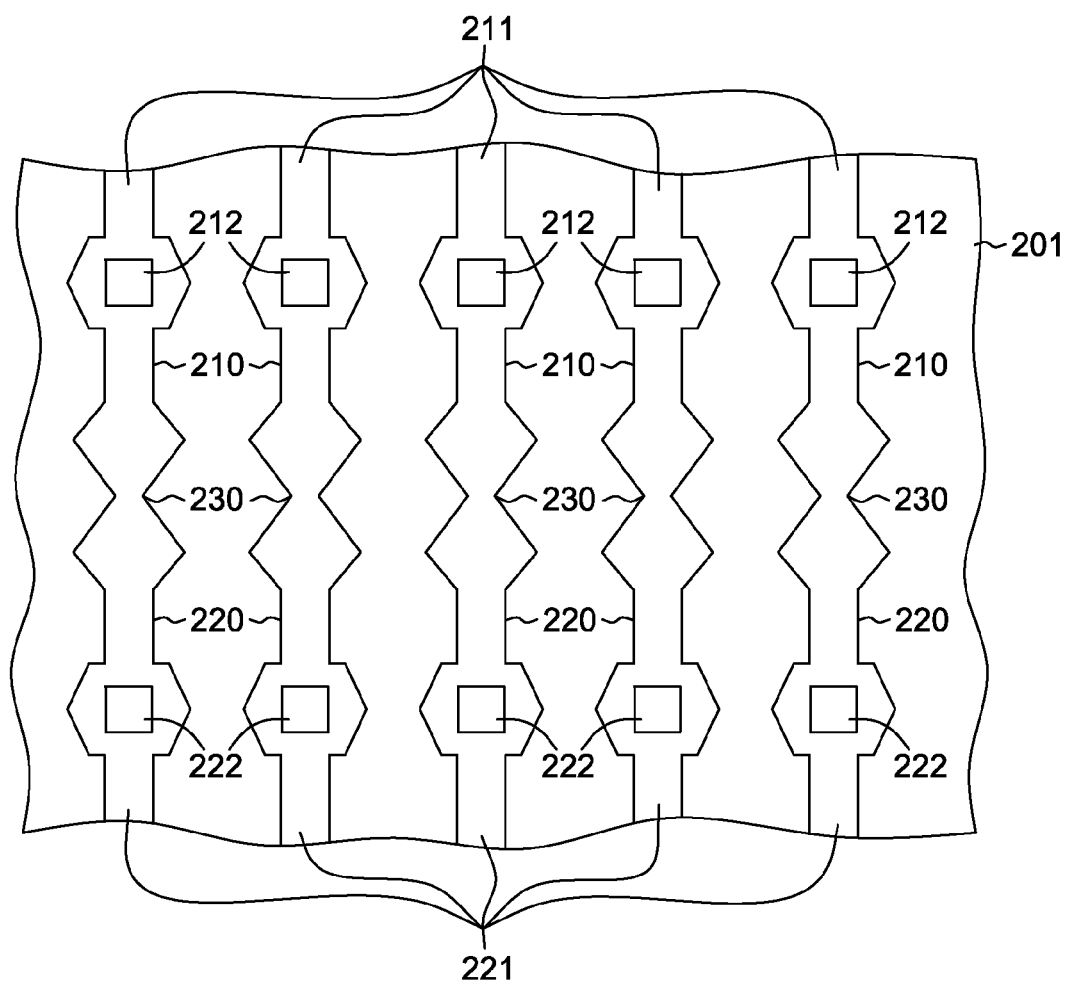
FIG. 2G depicts the structure of FIG. 2F after providing a conductive contact(s) within the anode region(s) and the cathode region(s) of the semiconductor fuse(s) thereof, in accordance with one or more aspects of the present invention.

FIG. 2G depicts the structure of FIG. 2F after providing anode contact(s) 212 within anode region(s) 210 and cathode contact(s) 222 within cathode region(s) 220 of the semiconductor fuse(s) thereof, in accordance with one or more aspects of the present invention. In one embodiment, the anode contact and/or the cathode contact can be formed during the formation of a first metallization layer of an integrated circuit, such as the metal one (M1) layer. In another embodiment, the fuse link region of the semiconductor fuse can be reacted with at least one metal to form a semiconductor-metal alloy. For example, the semiconductor fuse can include silicon (Si), and fuse link portion 230 can be reacted with a metal, such as nickel (Ni), to form a silicide, such as nickel silicide (NiSi).

Figure 3A:
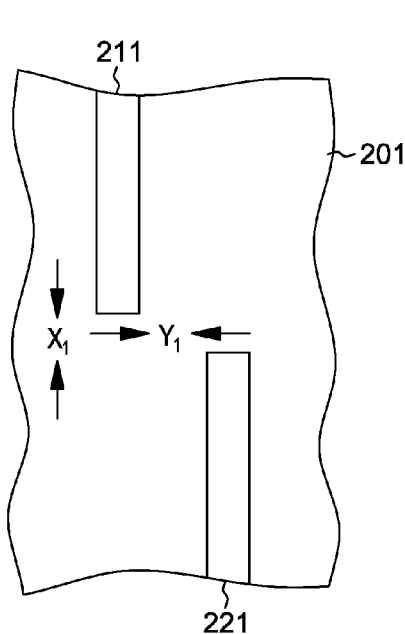
FIGS. 3A-3B depict another process for fabricating a semiconductor fuse, in accordance with one or more aspects of the present invention.
Figure 3B:
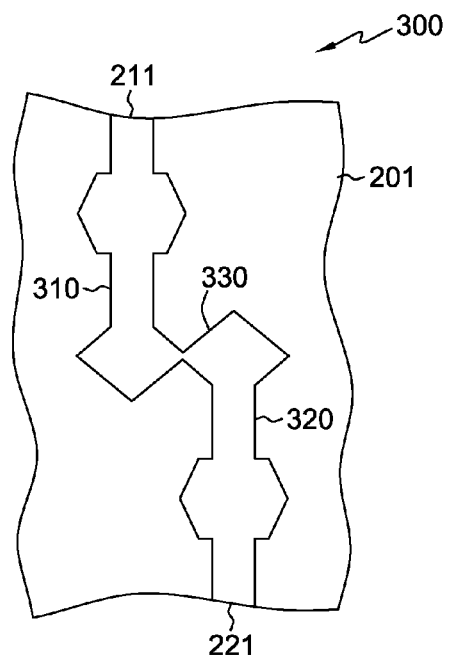

FIGS. 3A-3B depict another process for fabricating a semiconductor fuse 300, in accordance with one or more aspects of the present invention. In the embodiment of FIG. 3A, the tips of first fin structure 211 and second fin structure 221 are separated in both an x-direction by a distance $x_1$ and in a y-direction by a distance $y_1$. In the embodiment of FIG. 3B, semiconductor fuse 300 has been fabricated using techniques described herein. As depicted, semiconductor fuse 300 includes a fuse link region 330. By tuning the separation of first fin structure 211 and second fin structure 221 in both the x-direction, and the y-direction, fuse link region 330 can be formed with an appropriate smallest minimum dimension so that an appropriate programming current can open circuit semiconductor fuse 300.

Figure 4A:
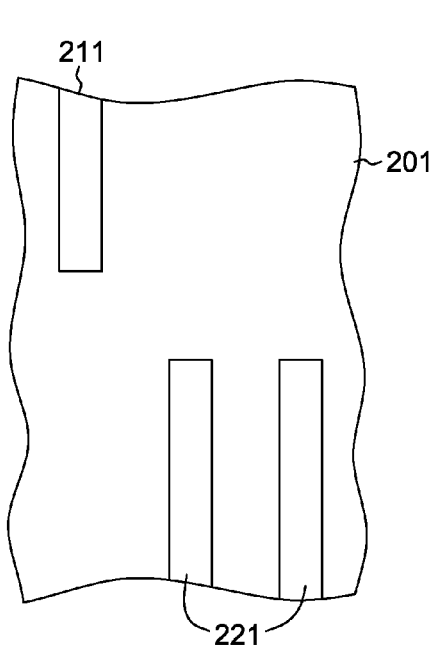
FIGS. 4A-4B depict another process for fabricating a semiconductor fuse, in accordance with one or more aspects of the present invention.
Figure 4B:
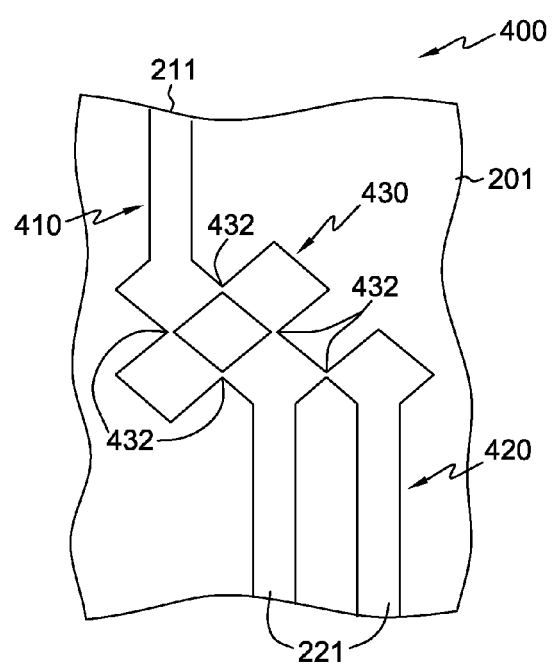

FIGS. 4A-4B depict another process for fabricating a semiconductor fuse 400, in accordance with one or more aspects of the present invention. In the embodiment of FIGS. 4A-4B, semiconductor fuse 400 includes anode region 410 and cathode region 420, and anode region 410 includes a first fin 211 and cathode region 420 includes two second fins 221. In such an embodiment, the surface area of anode region 410 can be greater than the surface area of cathode region 420, for example, to facilitate dissipation of heat.

In the embodiment of FIG. 4B, a fuse link region 430 can be epitaxially formed from the tips of first fin 211 and multiple second fins 221. In such a case, four substantially diamond shaped epitaxial structures can be formed and can merge during fabrication of semiconductor fuse 400. Such a configuration can lead to the formation of multiple fuse links 432, which can have the same or different minimum dimensions. If a programming current is applied to semiconductor fuse 400, multiple fuse links 432 can open circuit sequentially or simultaneously in order to allow for programming and subsequent sensing of more than one bit from semiconductor fuse 400.

FIGS. 5A-5B depict another process for fabricating a semiconductor fuse, in accordance with one or more aspects of the present invention. In the embodiment of FIGS. 5A-5B, semiconductor fuse 500 includes a fuse link region 530 that is located between two first fin structures 211 and opposite a second fin structure 221. In such an example, fuse link region 530 can be formed so that an appropriate programming current can open circuit semiconductor fuse 500.

FIGS. 6A-6B depict another process for fabricating a semiconductor fuse 600, in accordance with one or more aspects of the present invention. In the embodiment of FIGS. 6A-6B, first fin structure 211 and second fin structures 221 are substantially parallel, with their tips aligned in vertical direction. By appropriately masking the fin structures during epitaxial formation, a fuse link region 630 can be formed so that an epitaxial structure overlies the ends of both second fin structure 221. In such an example, a surface area of the cathode region can be larger than a surface area of the anode region, facilitating dissipation of heat from applying a programming current to semiconductor fuse 600.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes,"

or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
  fabricating a semiconductor fuse, the semiconductor fuse comprising an anode region and a cathode region electrically linked by a fuse link region, and the fabricating comprising:
    forming, epitaxially, the fuse link region between the anode region and the cathode region of the semiconductor fuse, wherein the fuse link region facilitates the semiconductor fuse open circuiting from applying a programming current between the anode region and the cathode region thereof and wherein forming, epitaxially, the fuse link region comprises forming multiple fuse links, wherein one fuse link of the multiple fuse links facilitates the semiconductor fuse open circuiting from the applying the programming current, and another fuse link of the multiple fuse links facilitates the semiconductor fuse open circuiting from applying another programming current between the anode region and the cathode region of the semiconductor fuse.

2. The method of claim 1, wherein the forming comprises:
  forming, epitaxially, a semiconductor material from exposed surfaces of the anode region and the cathode region, wherein the semiconductor material at least partially merges during the forming to form the fuse link region of the semiconductor fuse.

3. The method of claim 1, wherein the forming comprises:
  forming the fuse link region with a smaller minimum dimension than a minimum dimension of the anode region or another minimum dimension of the cathode region of the semiconductor fuse, the smaller minimum dimension of the fuse link region facilitating the semiconductor fuse open circuiting from the applying the programming current.

4. The method of claim 1, wherein the anode region of the semiconductor fuse facilitates dissipation of heat produced from the applying the programming current to open circuit the semiconductor fuse.

5. The method of claim 1, wherein the fabricating comprises fabricating the cathode region with a first surface area and the anode region with a second surface area, wherein the second surface area is larger than the first surface area.

6. The method of claim 1, further comprising:
  reacting the fuse link region of the semiconductor fuse with at least one metal to form a semiconductor-metal alloy therein, wherein the semiconductor-metal alloy facilitates electromigration of the fuse link region from the applying the programming current to thereby open circuit the semiconductor fuse.

7. The method of claim 1, wherein the fabricating comprises forming the fuse link region to include at least one tapered region, the at least one tapered region of the fuse link region facilitating the semiconductor fuse open circuiting from the applying the programming current.

8. The method of claim 1, wherein the fabricating further comprises providing at least one first fin structure and at least one second fin structure, the at least one first fin structure comprising the anode region and the at least one second fin structure comprising the cathode region, wherein the forming comprises:
  forming, epitaxially, a semiconductor material from exposed surfaces of the at least one first fin structure, including the anode region thereof, and the at least one second fin structure, including the cathode region thereof, wherein the semiconductor material at least partially merges during the forming to form the fuse link region of the semiconductor fuse.

9. The method of claim 8, wherein the providing comprises providing an isolation material between the at least one first fin structure and the at least one second fin structure, and the forming comprises:
  forming the semiconductor material from exposed upper surfaces of the at least one first fin structure and the at least one second fin structure, wherein the fuse link region is formed at least partially over the isolation material.

10. The method of claim 8, wherein the providing comprises:
  providing the at least one first fin structure substantially parallel to the at least one second fin structure, wherein a tip of the at least one first fin structure is substantially aligned with another tip of the at least one second fin structure.

11. The method of claim 8, wherein providing the at least one first fin structure further comprises two fin structures, and the fuse link region comprises multiple fuse links, wherein one of the multiple fuse links is between one of the two fin structures and the at least one second fin, and the other of the multiple fuse links is between the other of the two fin structures and the at least one second fin.

12. The method of claim 8, wherein providing the at least one first fin structure or the at least one second fin structure further comprises a transistor, the transistor comprising a source region and a drain region separated by a channel region, and the forming further comprises:
  forming, epitaxially, the semiconductor material from exposed surfaces of the at least one first fin structure or the at least one second fin structure to form the source region and the drain region of the transistor.

13. A structure comprising:
  a semiconductor fuse, the semiconductor fuse comprising:
    an anode region and a cathode region electrically linked by a fuse link region, wherein the fuse link region comprises an epitaxial structure and facilitates the semiconductor fuse open circuiting from applying a programming current between the anode region and the cathode region thereof, wherein the fuse link region comprises multiple fuse links, wherein one fuse link of the multiple fuse links facilitates the semiconductor fuse open circuiting from the applying the programming current, and another fuse link of the multiple fuse links facilitates the semiconductor fuse open circuiting from applying another programming current between the anode region and the cathode region of the semiconductor fuse, and wherein the epitaxial structure is in at least partial crystallographic alignment with the anode region and the cathode region of the semiconductor fuse.

14. The structure of claim 13, wherein the fuse link region has a smaller minimum dimension than a minimum dimension of the anode region or another minimum dimension of the cathode region of the semiconductor fuse, the smaller minimum dimension of the fuse link region facilitating the semiconductor fuse open circuiting from the applying the programming current.

15. The structure of claim 13, wherein the anode region of the semiconductor fuse facilitates dissipation of heat produced from the applying the programming current to open circuit the semiconductor fuse.

16. The structure of claim 13, wherein the cathode region has a first surface area and the anode region has a second surface area, wherein the second surface area is larger than the first surface area.

17. The structure of claim 13, wherein the fuse link region of the semiconductor fuse comprises a semiconductor-metal alloy, wherein the semiconductor-metal alloy facilitates electromigration of the fuse link region from the applying the programming current to thereby open circuit the semiconductor fuse.

18. The structure of claim 13, further comprising at least one first fin structure and at least one second fin structure, the at least one first fin structure comprising the anode region and the at least one second fin structure comprising the cathode region, wherein the epitaxial structure is in at least partial crystallographic alignment with the at least one first fin structure and the at least one second fin structure.

19. The structure of claim 18, further comprising an isolation material disposed between the at least one first fin structure and the at least one second fin structure, wherein the fuse link region is disposed at least partially over the isolation material.

* * * * *